United States Patent
Kobayashi et al.

(10) Patent No.: US 8,119,313 B2
(45) Date of Patent: Feb. 21, 2012

(54) METHOD FOR MANUFACTURING SEMICONDUCTOR DEVICE

(75) Inventors: Katsutoshi Kobayashi, Kanagawa-ken (JP); Daizo Muto, Kanagawa-ken (JP); Koutarou Sho, Kanagawa-ken (JP); Tsukasa Azuma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 212 days.

(21) Appl. No.: 12/696,142

(22) Filed: Jan. 29, 2010

(65) Prior Publication Data

US 2010/0227262 A1 Sep. 9, 2010

(30) Foreign Application Priority Data

Mar. 6, 2009 (JP) ................................. 2009-053337

(51) Int. Cl.
*G03C 5/00* (2006.01)
(52) U.S. Cl. ........... 430/30; 430/311; 430/330; 430/396
(58) Field of Classification Search ................ 430/30, 430/311, 330, 396
See application file for complete search history.

(56) References Cited

U.S. PATENT DOCUMENTS

| 7,417,707 | B2 * | 8/2008 | Corbett | 355/30 |
| 7,561,250 | B2 * | 7/2009 | Liebregts et al. | 355/53 |
| 8,040,491 | B2 * | 10/2011 | Owa et al. | 355/30 |
| 2010/0099036 | A1 * | 4/2010 | Kawamura et al. | 430/30 |

FOREIGN PATENT DOCUMENTS

| JP | 2007-150071 | 6/2007 |
| JP | 2009-004478 | 1/2009 |

* cited by examiner

*Primary Examiner* — Christopher Young
(74) *Attorney, Agent, or Firm* — Finnegan, Henderson, Farabow, Garrett & Dunner, L.L.P.

(57) ABSTRACT

A method for manufacturing a semiconductor device, includes: supplying a liquid resist containing a water-repellent additive to a surface of a rotating semiconductor wafer fixed to a rotary support to form a resist film to a design thickness on the surface of the semiconductor wafer; spin drying the resist film; bringing a liquid into contact with the resist film and exposing the resist film through the liquid after the spin drying; developing the resist film to form a resist pattern; and performing processing on the semiconductor wafer.

A condition for adjusting contact angle between the resist film surface and the liquid is controlled so that the contact angle assumes a desired value, the condition including at least one selected from the group consisting of spin drying time for the resist film, resist temperature during the supplying, pressure of an atmosphere above the semiconductor wafer surface, and humidity of the atmosphere above the semiconductor wafer surface.

20 Claims, 4 Drawing Sheets

METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2009-053337, filed on Mar. 6, 2009; the entire contents of which are incorporated herein by reference.

BACKGROUND OF THE INVENTION

This invention relates to a method for manufacturing a semiconductor device including a patterning process based on immersion exposure.

A method for manufacturing a semiconductor device typically includes numerous processes for depositing a plurality of materials, including a subject film, on a semiconductor substrate and patterning them into desired patterns. In the patterning process, a film of photosensitive material, called resist, is formed on the subject film, and the resist film is subjected to selective exposure using a mask (reticle). Subsequently, the exposed or unexposed portion of the resist film is removed by development to form a resist pattern, which is further used as a mask to process the subject film.

Commonly used exposure light sources include ultraviolet lasers such as KrF excimer lasers and ArF excimer lasers. However, with the miniaturization of integrated circuit patterns, the required resolution is falling below the wavelength of such ultraviolet light. Thus, exposure process margins such as exposure amount margin and focus margin are becoming insufficient.

Studies to increase the numerical aperture (NA) toward resolution enhancement have now led to the immersion exposure technique in which exposure is performed through a liquid filled between the resist film surface and the projection lens. In such immersion exposure, the immersion liquid is in contact with the resist film surface, and the number of defects depends on the contact angle. For instance, in scan exposure, if the contact angle of the immersion liquid in the scan direction (advancing contact angle) is too high, defects due to air inclusions are generated. On the other hand, if the contact angle of the immersion liquid on the opposite side of the scan direction (receding contact angle) is low, the immersion liquid is left behind on the resist and causes defects due to remaining liquid.

As a resist for immersion lithography, JP-A-2009-004478 (Kokai), for instance, proposes use of a topcoat-less resist, that is, a resist requiring no protective film between the resist film and the immersion liquid. When the topcoat-less resist is used, the concentration distribution of resist components including a water-repellent additive in the film thickness direction varies with the wafer rotation speed during spin coating of the resist, causing variation in the contact angle of the immersion liquid in contact with the resist surface. Furthermore, the film thickness of the resist film is controlled by the wafer rotation speed. Hence, if the wafer rotation speed is changed with the design film thickness, there is concern about variation in the contact angle of the resist surface and generation of defects during immersion exposure. Thus, it is desirable to maintain the contact angle of the resist surface at a desired value irrespective of the design film thickness of the resist film, or the wafer rotation speed.

SUMMARY OF THE INVENTION

According to an aspect of the invention, there is provided a method for manufacturing a semiconductor device, including: supplying a liquid resist containing a water-repellent additive to a surface of a rotating semiconductor wafer fixed to a rotary support to form a resist film to a design thickness on the surface of the semiconductor wafer; spin drying the resist film after the forming the resist film; bringing a liquid into contact with the resist film and exposing the resist film through the liquid filled between a surface of the resist film and a projection optical system after the spin drying; developing the resist film after the exposure to form a resist pattern; and performing processing on the semiconductor wafer by using the resist pattern as a mask, a condition for adjusting contact angle between the resist film surface and the liquid being controlled in accordance with rotation speed of the semiconductor wafer or the design thickness of the resist film so that the contact angle assumes a desired value, the condition including at least one selected from the group consisting of spin drying time for the resist film, resist temperature during the supplying, pressure of an atmosphere above the semiconductor wafer surface, and humidity of the atmosphere above the semiconductor wafer surface.

According to an aspect of the invention, there is provided a method for manufacturing a semiconductor device, including: supplying a liquid resist containing a water-repellent additive to a surface of a rotating semiconductor wafer fixed to a rotary support to form a resist film to a design thickness on the surface of the semiconductor wafer; spin drying the resist film after the forming the resist film; bringing a liquid into contact with the resist film and exposing the resist film through the liquid filled between a surface of the resist film and a projection optical system after the spin drying; developing the resist film after the exposure to form a resist pattern; and performing processing on the semiconductor wafer by using the resist pattern as a mask, concentration distribution of the water-repellent additive contained in the resist film being controlled so that contact angle between the resist film surface and the liquid assumes a desired value with a thickness of the resist film maintained at the design thickness.

According to an aspect of the invention, there is provided a method for manufacturing a semiconductor device, including: supplying a liquid resist to a surface of a rotating semiconductor wafer fixed to a rotary support to form a resist film to a design thickness on the surface of the semiconductor wafer; supplying a solution containing a water-repellent additive to the surface of the semiconductor wafer during, before, or after the supplying a liquid resist; bringing a liquid into contact with the resist film and exposing the resist film through the liquid filled between a surface of the resist film and a projection optical system; developing the resist film after the exposure to form a resist pattern; and performing processing on the semiconductor wafer by using the resist pattern as a mask, supply amount of the solution containing the water-repellent additive being controlled in accordance with rotation speed of the semiconductor wafer or the design film thickness of the resist film so that contact angle between the resist film surface and the liquid assumes a desired value.

DETAILED DESCRIPTION

Figure 1:
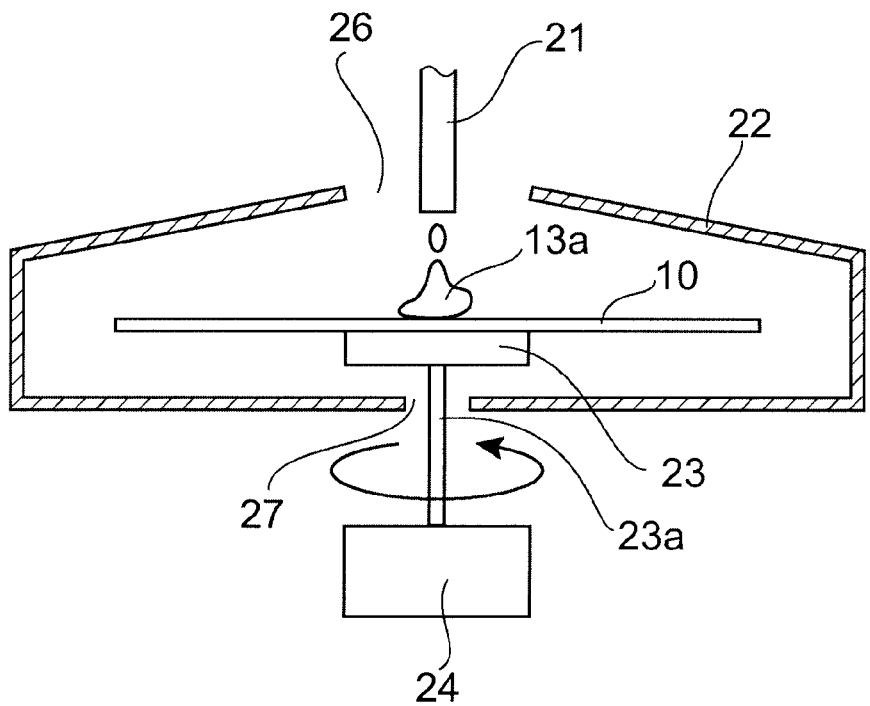
FIG. 1 is a schematic view of a resist coater.

According to an embodiment of the invention, a liquid resist is supplied to the surface of a semiconductor wafer by spin coating. FIG. 1 is a schematic view of a resist coater used therefor.

This resist coater includes a cup 22 with openings 26, 27 formed at the top and bottom center, respectively, and a rotary support (or spin chuck) 23 is provided inside the cup 22. A semiconductor wafer 10 is fixed to the rotary support 23 illustratively by a vacuum chuck. In this state, the space above, below, and around the semiconductor wafer 10 is surrounded by the cup 22.

A nozzle 21 is provided near the upper opening 26 of the cup 22, and its discharge port is opposed to the surface (subject surface) of the semiconductor wafer 10 fixed to the rotary support 23.

The rotary support 23 is coupled to a motor 24 by a rotary shaft 23a penetrating through the lower opening 27 of the cup 22 and protruding out of the cup 22. The driving force received from the motor 24 enables the rotary support 23 and the semiconductor wafer 10 fixed thereto to rotate around the rotary shaft 23a.

In this embodiment, immersion exposure is performed in which a resist film is exposed through a liquid (such as pure water) filled between the resist film surface and the projection optical system (projection lens) of the exposure apparatus, and a resist requiring no protective film, or a topcoat-less resist, is used as a resist for the immersion exposure. The topcoat-less resist is a resist whose surface is made water-repellent by addition of a water-repellent additive, eliminating the need to form a water-repellent protective film separately on the resist film.

Figure 2A:
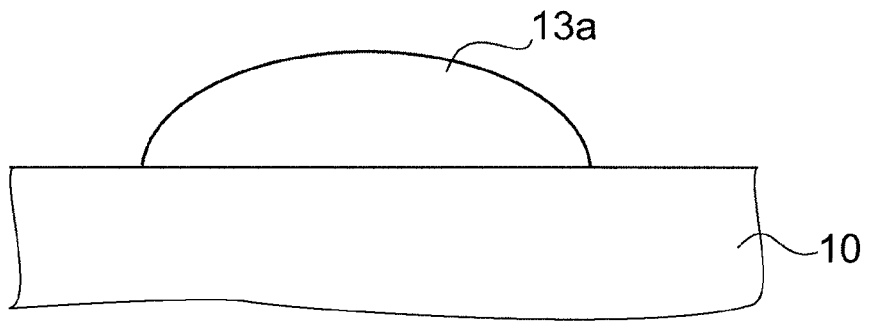
FIGS. 2A and 2B are schematic views showing dropping of a topcoat-less resist for immersion exposure and formation of a water-repellent layer on a resist surface side by the wafer rotation.
Figure 2B:
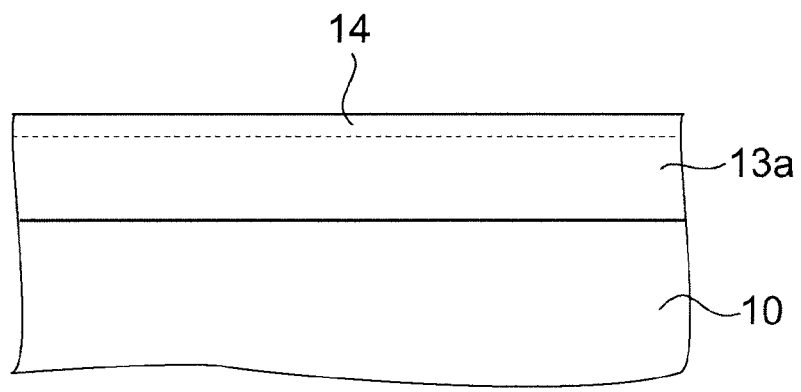

Spin coating is a technique in which the semiconductor water 10 is rotated together with the rotary support 23 so that a liquid resist 13a (FIG. 2A) dropped from the nozzle 21 is spread into a film with uniform thickness on the surface of the semiconductor water 10. Here, the water-repellent additive added to the resist 13a is localized on the surface side and forms a water-repellent layer 14 on the surface side of the resist 13a as shown in FIG. 2B.

The film thickness of the resist 13a at this time depends primarily on the rotation speed of the semiconductor water 10. Furthermore, in the resist 13a containing the water-repellent additive, the manner of localization of the water-repellent additive (concentration distribution of the water-repellent additive in the film thickness direction) varies with the rotation speed of the semiconductor wafer 10, causing variation in the contact angle between the resist surface and the immersion liquid in contact with this surface (hereinafter also simply referred to as contact angle). In general, the aforementioned contact angle tends to increase when the water-repellent additive exists more on the resist surface side.

Figure 3:
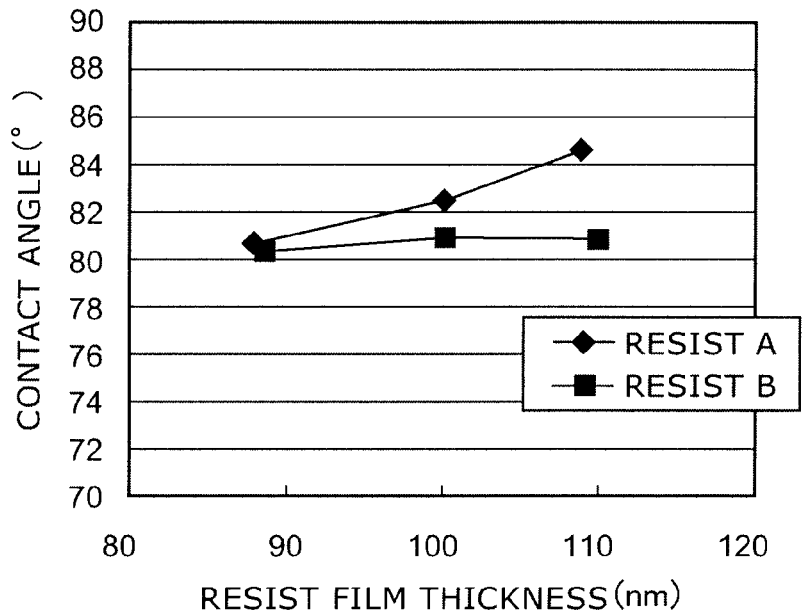
FIG. 3 shows a graph illustrating an example of the relationship between resist film thickness and contact angle on the resist surface.

Variation of the aforementioned contact angle in accordance with the rotation speed of the semiconductor wafer 10 translates into variation of the contact angle in accordance with the resist film thickness determined by the rotation speed of the semiconductor wafer 10. FIG. 3 shows an example of this correlation between resist film thickness and contact angle.

In FIG. 3, the relationship between film thickness (nm) and contact angle (°) is shown illustratively for two resists A and B which are different in type (or material composition). In the case of FIG. 3, resist A exhibits a larger rate of variation in contact angle with respect to variation in film thickness than resist B.

From the foregoing, when the resist film thickness is controlled by the wafer rotation speed, the contact angle of the resist surface varies with the design film thickness, and the scan tolerance during immersion exposure fluctuates with the design film thickness. To change the film thickness without varying the contact angle, it is necessary to change the amount of water-repellent additive added to the resist. This requires preparation of a plurality of types of resist with a substantially different composition for each design film thickness, leading to cost increase.

Thus, in this embodiment, conditions other than the wafer rotation speed are used to control the localizability (concentration distribution in the film thickness direction) of the water-repellent additive, thereby controlling the contact angle. That is, the concentration distribution of the water-repellent additive contained in the resist film is controlled so that the contact angle assumes a desired value while maintaining the film thickness of the resist film at a desired design film thickness.

Figure 4:
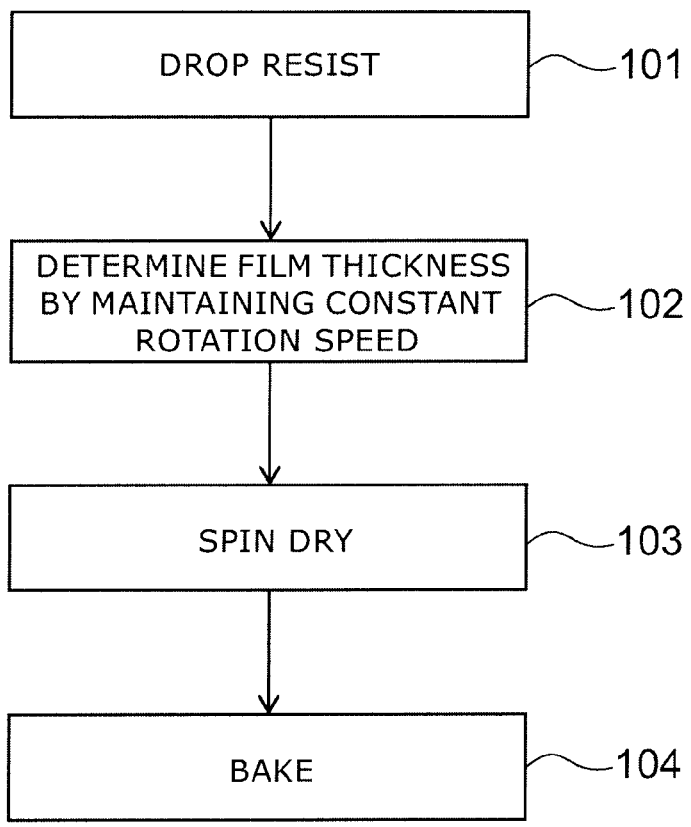
FIG. 4 is a flow chart showing major steps in the resist formation in this embodiment of the in the invention.

FIG. 4 shows major steps in resist film formation.

First, a liquid resist 13a is dropped from the nozzle 21 onto the surface of the semiconductor wafer 10 fixed to the rotary support 23 (step 101). It may be dropped on the semiconductor wafer 10 yet to be rotated, or on the semiconductor wafer 10 already in the rotating state.

After the resist 13a is dropped, the rotation speed of the semiconductor wafer 10 is maintained at a desired constant rotation speed (step 102). This is the step for determining the film thickness of the resist 13a, where the rotation is controlled at the constant rotation speed and maintained for a prescribed period of time to achieve a desired film thickness, depending on the viscosity of the resist and the type of solvent contained therein.

With the aforementioned constant rotation speed being maintained, when the surface of the semiconductor wafer 10 is coated with the resist 13a to the desired film thickness, the supply of the resist 13a from the nozzle 21 is stopped, making a transition to a spin drying step 103 for simply rotating the semiconductor wafer 10 to evaporate the solvent in the resist 13a.

In this embodiment, the period of time for this spin drying step (drying time) is adjusted to control the concentration distribution in the film thickness direction of the water-repellent additive contained in the resist 13a, thereby controlling the contact angle of the resist surface. This resist drying time refers to the time from when the desired film thickness of the resist is obtained on the surface of the semiconductor wafer 10 and supply of the resist to the semiconductor wafer 10 is stopped until when the semiconductor wafer 10 stops rotation (the point of time when the rotation actually stops or the point of time when a stop command signal is outputted to the motor 24).

Figure 5:
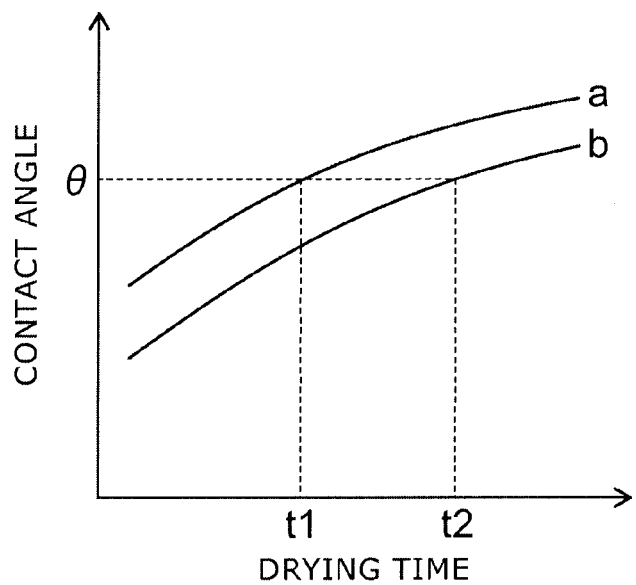
FIG. 5 is a schematic view showing an example of the relation ship between drying time in the spin drying step in FIG. 4 and the contact angle on the resist film surface.

To set this resist drying time, for instance, the correlation as illustrated in FIG. 5 is determined in advance to prepare a data set. On the basis thereof, the drying time to achieve a desired contact angle is set in accordance with the design film thickness of the resist.

In FIG. 5, the horizontal axis represents drying time in the aforementioned step 103 for spin drying the resist, and the vertical axis represents the contact angle made between the surface of the formed resist film and the immersion liquid in contact with this surface. This relationship is determined for each design film thickness (the example of FIG. 5 shows two film thicknesses a and b). It is noted that the film thickness can also be translated as rotation speed because the film thickness is determined by the wafer rotation speed in the aforementioned step 102 for determining the film thickness.

In the case of FIG. 5, assume that θ, for instance, is to be obtained as the contact angle of the resist film surface. In this case, the desired contact angle θ is achieved by setting the drying time to t1 for design film thickness a, and setting the drying time to t2 for design film thickness b.

In the step for spin drying the resist, contact angle control is given a higher priority than drying to set the drying time. Even if the drying time is relatively short and results in insufficient drying, the solvent can be completely evaporated from the resist in the next baking step 104 to obtain a solid-phase resist film.

The parameter used to control the contact angle (the condition at the time of forming the resist film) is not limited to the resist drying time, but it is also possible to use resist temperature, the pressure of the atmosphere above the semiconductor wafer surface, and the humidity of this atmosphere.

The resist temperature is the temperature of the liquid resist discharged from the nozzle 21. Increase of this resist temperature accelerates evaporation of the solvent in the dropped resist, which results in a larger amount of water-repellent additive migrating in the resist toward the surface in association with the evaporation of the solvent, and tends to increase the contact angle of the resist surface.

In the coater of FIG. 1, the pressure of the atmosphere above the semiconductor wafer surface is the atmosphere pressure in the cup 22. Increase of this pressure suppresses evaporation of the solvent in the dropped resist and also suppresses migration of the water-repellent additive toward the resist surface, and the contact angle of the resist surface tends to decrease.

The humidity of the atmosphere above the semiconductor wafer surface is the humidity in the cup 22 of the coater. Increase of this humidity suppresses evaporation of the solvent in the dropped resist and also suppresses migration of the water-repellent additive toward the resist surface, and the contact angle of the resist surface tends to decrease.

Also for these resist temperature, atmosphere pressure, and atmosphere humidity, like the resist drying time, the aforementioned correlation as illustrated in FIG. 5 is determined in advance to prepare a data set. On the basis thereof, the resist temperature, atmosphere pressure, and atmosphere humidity to achieve a desired contact angle are set in accordance with the design film thickness.

Here, it is possible to control the contact angle by adjusting one of the resist drying time, resist temperature, atmosphere pressure, and atmosphere humidity, or to control the contact angle by adjusting two or more of these conditions.

Next, the process subsequent to resist film formation is described with reference to FIG. 6.

In FIG. 6, the semiconductor wafer 10 is illustratively made of a silicon or other semiconductor substrate 11 with a subject film 12 such as a silicon oxide film formed thereon. However, a plurality of films may be formed on the semiconductor substrate 11, or the semiconductor wafer 10 may consist only of the semiconductor substrate 11. Furthermore, between the semiconductor wafer 10 and a resist film 13, other films such as an anti-reflection coating may be formed as needed.

Figure 6A:
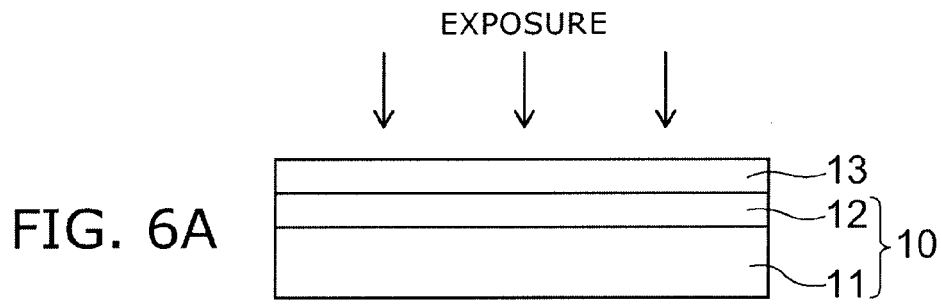
FIGS. 6A to 6C are schematic views showing pattern formation steps in a method for manufacturing a semiconductor device according to this embodiment of the invention.

After the resist film 13 is formed on the surface of the semiconductor wafer 10, a mask (or reticle), not shown, is used to perform exposure on the resist film 13 as shown in FIG. 6A. This is immersion exposure in which exposure is performed on the resist film 13 through a liquid (not shown) filled between the surface of the resist film 13 and the projection optical system (projection lens).

Figure 6B:
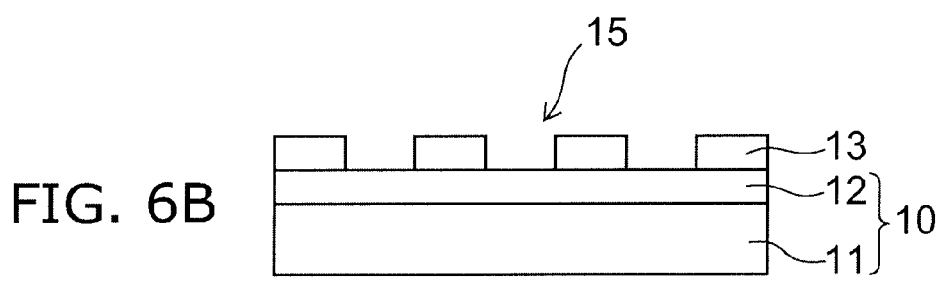

Next, after post-exposure baking, the resist film 13 is developed. For instance, for a chemically amplified resist containing a photoacid generator, an alkaline developer can be used. By this development, the exposed or unexposed portion of the resist film 13 is removed, and a resist pattern 15 is formed as shown in FIG. 6B.

Figure 6C:
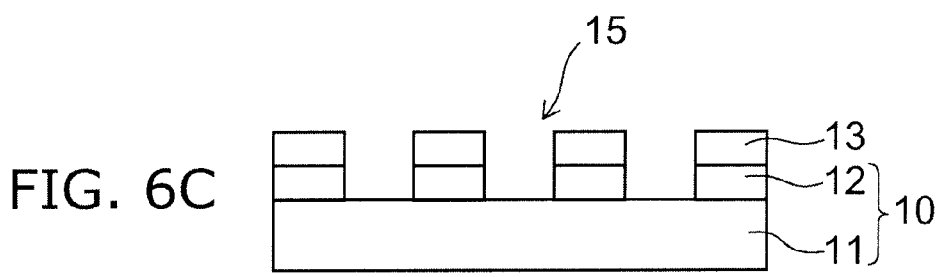

Next, the resist pattern 15 is used as a mask to perform processing such as ion implantation and etching on the semiconductor wafer 10. In this embodiment, for instance, the resist pattern 15 is used as a mask to dry etch the subject film 12. Thus, as shown in FIG. 6C, the subject film 12 is patterned.

According to this embodiment described above, the film thickness of the resist film is determined by the wafer rotation speed during spin coating of the resist, and parameters other than the wafer rotation speed (conditions for adjusting the contact angle, such as resist drying time, resist temperature, atmosphere pressure, and atmosphere humidity) are used to control the localizability (concentration distribution in the film thickness direction) of the water-repellent additive in the resist, thereby controlling the contact angle of the resist film surface. This can prevent generation of defects during immersion exposure due to variation of the contact angle with the design film thickness, and accurate patterning can be performed.

For instance, if the film thickness of the film to be etched is increased and the aspect ratio of an opening (or hole) to be formed by etching is increased, or if the etching selection ratio of the film to be etched with respect to the resist film is relatively low, the film thickness of the resist film may be increased to enhance the etching resistance of the resist film. According to this embodiment, such change in the film thickness of the resist film, that is, change in the wafer rotation speed during spin coating, can also be addressed without varying the contact angle of the resist film surface.

Next, other embodiments of the invention are described with reference to FIG. 7.

Figure 7A:
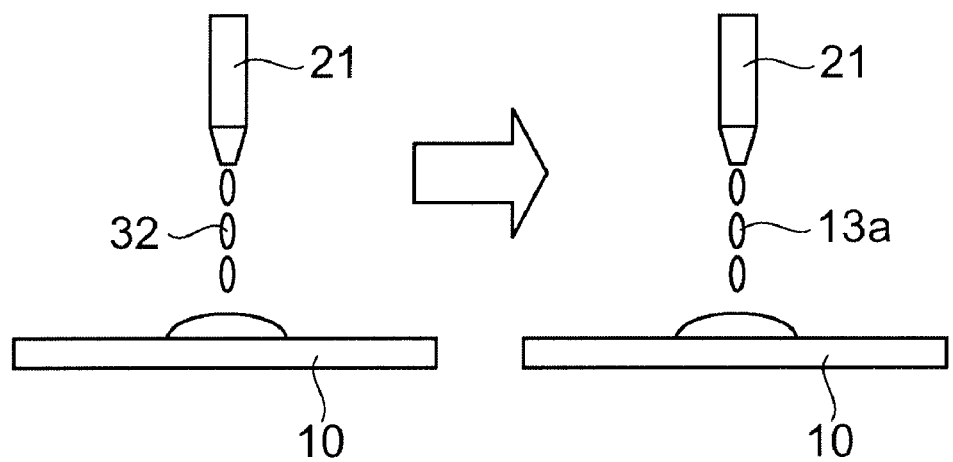
FIGS. 7A and 7B are schematic views showing supplying a prewet thinner and a resist in methods for manufacturing a semiconductor device according to other embodiments of the invention.

The embodiment shown in FIG. 7A includes, before supplying the liquid resist 13a to the surface of the semiconductor wafer 10, the process for supplying a prewet thinner 32 to the surface of the semiconductor wafer 10 to increase wettability of the surface of the semiconductor wafer 10, and a water-repellent additive is added to the prewet thinner 32. Discharge of the prewet thinner 32 to the surface of the semiconductor wafer 10 is performed before discharge of the resist 13a using the same nozzle 21 as the resist 13a is discharged.

Figure 7B:
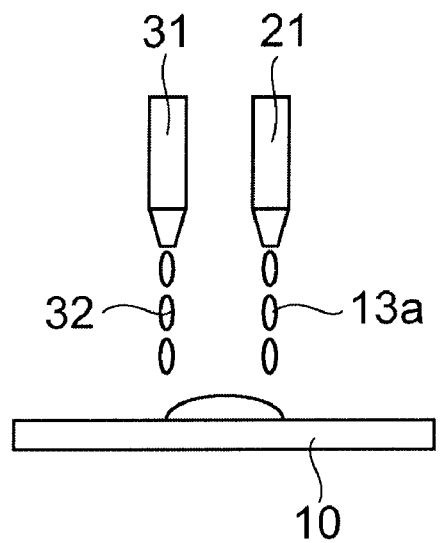

In the embodiment shown in FIG. 7B, simultaneously with resist supply, the prewet thinner 32 containing a water-repellent additive is discharged from a nozzle 31 different from the nozzle 21 for discharging the resist 13a.

In these embodiments, the amount of the prewet thinner 32 supplied to the surface of the semiconductor wafer 10 is adjusted to control the amount of the contained water-repellent additive supplied to the semiconductor wafer 10, thereby controlling the contact angle of the resist surface. To set the supply amount of the prewet thinner 32, like the previous embodiment, the correlation among the design film thickness (wafer rotation speed during coating), the supply amount of the prewet thinner, and the contact angle is determined in advance to prepare a data set. On the basis thereof, the supply amount to achieve a desired contact angle is set in accordance with the design film thickness of the resist.

Also in the embodiments shown in FIGS. 7A and 7B, the film thickness of the resist film is determined by the wafer rotation speed, and a parameter other than the wafer rotation speed (supply amount of the prewet thinner 32 containing the water-repellent additive) is used to control the contact angle of the resist film surface. This can prevent generation of defects during immersion exposure due to variation of the contact angle with the design film thickness, and accurate patterning can be performed.

In the embodiments of FIGS. 7A and 7B, after the prewet thinner 32 and the resist 13a are dropped, they are mixed on the surface of the semiconductor wafer 10. Hence, the water-repellent additive added to the prewet thinner 32 becomes contained in the resist film covering the surface of the semiconductor wafer 10. The water-repellent additive may or may not be added to the resist 13a before being dropped.

Preparing and controlling a plurality of types of resist containing a water-repellent additive with different concentrations requires much effort and cost. In contrast, in this embodiment, the contact angle of the resist film surface can be controlled simply by controlling the amount of the prewet thinner 32 containing the water-repellent additive supplied to the surface of the semiconductor wafer 10 irrespective of the film thickness (wafer rotation speed during coating). It is only necessary to prepare one type of resist. For this one type of resist, the film thickness is controlled by the wafer rotation speed during coating, and the contact angle of its surface is controlled by the supply amount of the prewet thinner.

Here, the solution containing the water-repellent additive is not limited to the prewet thinner, but other solutions may also be used. Furthermore, the timing for supplying the solution containing the water-repellent additive is also not limited to before or during supplying the resist, but may be after supplying the resist. Any modification is possible as long as the resist is mixed with the solution containing the water-repellent additive so that the water-repellent additive is contained in the resist covering the surface of the semiconductor wafer.

It is noted that adding a water-repellent additive to a prewet thinner and supplying it to a semiconductor wafer does not mean addition of a new step to the existing process including the step for supplying a prewet thinner.

The invention claimed is:

1. A method for manufacturing a semiconductor device, comprising:
supplying a liquid resist containing a water-repellent additive to a surface of a rotating semiconductor wafer fixed to a rotary support to form a resist film to a design thickness on the surface of the semiconductor wafer;
spin drying the resist film after the forming the resist film;
bringing a liquid into contact with the resist film and exposing the resist film through the liquid filled between a surface of the resist film and a projection optical system after the spin drying;
developing the resist film after the exposure to form a resist pattern; and
performing processing on the semiconductor wafer by using the resist pattern as a mask,
a condition for adjusting contact angle between the resist film surface and the liquid being controlled in accordance with rotation speed of the semiconductor wafer or the design thickness of the resist film so that the contact angle assumes a desired value, the condition including at least one selected from the group consisting of spin drying time for the resist film, resist temperature during the supplying, pressure of an atmosphere above the semiconductor wafer surface, and humidity of the atmosphere above the semiconductor wafer surface.

2. The method according to claim 1, wherein correlations between the contact angle and the condition for adjusting the contact angle are prepared in advance, and the condition for adjusting the contact angle is set on the basis of the correlations.

3. The method according to claim 2, wherein the correlations are prepared for each of different values of the design thickness of the resist film.

4. The method according to claim 1, wherein a thickness of the resist film is determined by maintaining the rotation speed of the semiconductor wafer at a constant level during the supplying the liquid resist to the surface of the semiconductor wafer.

5. The method according to claim 1, further comprising:
baking after the spin drying.

6. A method for manufacturing a semiconductor device, comprising:
supplying a liquid resist containing a water-repellent additive to a surface of a rotating semiconductor wafer fixed to a rotary support to form a resist film to a design thickness on the surface of the semiconductor wafer;
spin drying the resist film after the forming the resist film;
bringing a liquid into contact with the resist film and exposing the resist film through the liquid filled between a surface of the resist film and a projection optical system after the spin drying;
developing the resist film after the exposure to form a resist pattern; and
performing processing on the semiconductor wafer by using the resist pattern as a mask,
concentration distribution of the water-repellent additive contained in the resist film being controlled so that contact angle between the resist film surface and the liquid assumes a desired value with a thickness of the resist film maintained at the design thickness.

7. The method for according to claim 6, wherein the concentration distribution of the water-repellent additive in a film thickness direction in the resist film is controlled.

8. The method according to claim 6, wherein the concentration distribution of the water-repellent additive is controlled by spin drying time for the resist film.

9. The method according to claim 6, wherein the concentration distribution of the water-repellent additive is controlled by resist temperature during the supplying.

10. The method according to claim 6, wherein the concentration distribution of the water-repellent additive is controlled by pressure of an atmosphere above the semiconductor wafer surface.

11. The method according to claim 6, wherein the concentration distribution of the water-repellent additive is controlled by humidity of an atmosphere above the semiconductor wafer surface.

12. The method according to claim 6, wherein a thickness of the resist film is determined by maintaining the rotation speed of the semiconductor wafer at a constant level during the supplying the liquid resist to the surface of the semiconductor wafer.

13. The method according to claim 6, further comprising:
baking after the spin drying.

14. A method for manufacturing a semiconductor device, comprising:

supplying a liquid resist to a surface of a rotating semiconductor wafer fixed to a rotary support to form a resist film to a design thickness on the surface of the semiconductor wafer;

supplying a solution containing a water-repellent additive to the surface of the semiconductor wafer during, before, or after the supplying a liquid resist;

bringing a liquid into contact with the resist film and exposing the resist film through the liquid filled between a surface of the resist film and a projection optical system;

developing the resist film after the exposure to form a resist pattern; and performing processing on the semiconductor wafer by using the resist pattern as a mask, supply amount of the solution containing the water-repellent additive being controlled in accordance with rotation speed of the semiconductor wafer or the design thickness of the resist film so that contact angle between the resist film surface and the liquid assumes a desired value.

15. The method according to claim 14, wherein the liquid resist and the solution containing the water-repellent additive are supplied to the surface of the semiconductor wafer to cause the water-repellent additive to be contained in the resist covering the surface of the semiconductor wafer.

16. The method according to claim 14, further comprising:
supplying a prewet thinner to the surface of the semiconductor wafer before supplying the liquid resist to the surface of the semiconductor wafer,
the water-repellent additive being added to the prewet thinner.

17. The method according to claim 16, wherein the contact angle is controlled by controlling a supply amount of the prewet thinner.

18. The method according to claim 14, further comprising:
simultaneously with supplying the liquid resist to the surface of the semiconductor wafer, supplying a prewet thinner to the surface of the semiconductor wafer from a nozzle used to supply the resist,
the water-repellent additive being added to the prewet thinner.

19. The method according to claim 18, wherein the contact angle is controlled by controlling a supply amount of the prewet thinner.

20. The method according to claim 14, wherein a thickness of the resist film is determined by maintaining the rotation speed of the semiconductor wafer at a constant level during the supplying the liquid resist to the surface of the semiconductor wafer.

* * * * *